US012200903B2

(12) United States Patent
Chiang et al.

(10) Patent No.: US 12,200,903 B2
(45) Date of Patent: Jan. 14, 2025

(54) HEAT DISSIPATION DEVICE

(71) Applicant: AURAS TECHNOLOGY CO., LTD., New Taipei (TW)

(72) Inventors: Ming-Yuan Chiang, New Taipei (TW); Mu-Shu Fan, New Taipei (TW); Chien-Yu Chen, New Taipei (TW)

(73) Assignee: AURAS TECHNOLOGY CO., LTD., New Taipei (TW)

( * ) Notice: Subject to any disclaimer, the term of this patent is extended or adjusted under 35 U.S.C. 154(b) by 241 days.

(21) Appl. No.: 17/869,958

(22) Filed: Jul. 21, 2022

(65) Prior Publication Data

US 2023/0115143 A1 Apr. 13, 2023

Related U.S. Application Data

(60) Provisional application No. 63/253,600, filed on Oct. 8, 2021.

(51) Int. Cl.
*H05K 7/20* (2006.01)

(52) U.S. Cl.
CPC ..... *H05K 7/20254* (2013.01); *H05K 7/20272* (2013.01); *H05K 7/2039* (2013.01)

(58) Field of Classification Search
CPC ........... H05K 7/20254; H05K 7/20272; H05K 7/2039
USPC ...................................... 165/80.4
See application file for complete search history.

(56) References Cited

U.S. PATENT DOCUMENTS

| | | | |
|---|---|---|---|
| 7,404,433 B1* | 7/2008 | Hu | H01L 23/473 257/E23.098 |
| 7,688,589 B2* | 3/2010 | Chiang | H01L 23/473 415/176 |
| 9,907,207 B1* | 2/2018 | Wu | H05K 7/20272 |
| 11,956,919 B2* | 4/2024 | Chen | F28D 9/0068 |
| 2004/0052663 A1* | 3/2004 | Laing | G06F 1/20 257/E23.098 |
| 2005/0092468 A1* | 5/2005 | Cheng | H01L 23/473 62/118 |
| 2005/0178526 A1* | 8/2005 | Naganawa | H01L 23/473 257/E23.098 |
| 2006/0021737 A1* | 2/2006 | Lee | H01L 23/473 257/E23.098 |
| 2006/0171801 A1* | 8/2006 | Manabe | H01L 23/473 415/176 |
| 2006/0185829 A1* | 8/2006 | Duan | H01L 23/473 257/E23.098 |
| 2008/0075611 A1* | 3/2008 | Lai | F04D 13/0606 417/420 |
| 2008/0128114 A1* | 6/2008 | Lai | H01L 23/473 165/80.4 |

(Continued)

*Primary Examiner* — Raheena R Malik
(74) *Attorney, Agent, or Firm* — Amin, Turocy & Watson, LLP

(57) ABSTRACT

A heat dissipation device is provided and includes: a casing; a base unit combined with the casing to form a water collecting chamber, a water inlet chamber, an action space and a water outlet chamber; a heat transfer structure disposed on an inner side of the base unit; a water inlet pipeline unit communicated with the water collecting chamber; a water outlet pipeline unit communicated with the water outlet chamber; and a pump unit disposed outside the casing and the base unit, and connected with the water inlet pipeline unit and the water outlet pipeline unit, so as to drive a working medium.

9 Claims, 4 Drawing Sheets

(56) References Cited

U.S. PATENT DOCUMENTS

| | | | |
|---|---|---|---|
| 2008/0169086 A1* | 7/2008 | Hu | F28D 1/05366 165/80.4 |
| 2008/0179044 A1* | 7/2008 | Hu | H01L 23/473 257/E23.098 |
| 2009/0044929 A1* | 2/2009 | Yeh | F28D 15/00 165/104.19 |
| 2017/0257979 A1* | 9/2017 | Wu | H01L 23/473 |
| 2018/0213677 A1* | 7/2018 | Wu | H01L 23/473 |
| 2019/0178583 A1* | 6/2019 | Chen | F28D 21/00 |
| 2019/0187763 A1* | 6/2019 | Chen | F04D 1/06 |
| 2022/0071058 A1* | 3/2022 | Chen | F28F 9/18 |
| 2023/0111086 A1* | 4/2023 | Chen | G06F 1/20 165/104.33 |
| 2023/0115143 A1* | 4/2023 | Chiang | H05K 7/2039 165/80.4 |
| 2023/0156958 A1* | 5/2023 | Fan | H05K 7/20272 165/80.4 |

\* cited by examiner

HEAT DISSIPATION DEVICE

BACKGROUND

1. Technical Field

The present disclosure relates to a heat dissipation field, and more particularly, to a heat dissipation device.

2. Description of Related Art

In response to modern demands, computers and various electronic devices have developed rapidly and their performance has been continuously improved, but in the process, the problem of heat dissipation brought about by high-performance hardware also ensues. Generally speaking, computers and various electronic devices usually use heat dissipation elements to dissipate heat. For example, a thermal paste or a heat sink is used to attach to the electronic elements to be dissipated, so as to absorb and dissipate the heat. However, the effect of this heat dissipation method is limited, so a heat dissipation module using a liquid cooling method has been developed.

The existing heat dissipation modules using the liquid cooling method generally use cooling liquid to absorb heat energy. For example, the cooling liquid is connected to the electronic elements to be dissipated, and the heated cooling liquid can flow to a lower temperature for heat exchange. After the heat exchange, the cooling liquid can flow to the electronic elements to be dissipated again to absorb heat energy. Therefore, a heat dissipation cycle is formed.

However, the existing heat dissipation modules have many problems regarding that the pump fails and thus the entire operation stops, the pump setting position is not flexible enough to cause a poor overall heat dissipation performance, and the inability to handle the large amount of heat generated by the graphics processor affects the peripheral power supply elements.

Therefore, how to provide a heat dissipation device that can solve the above problems of the prior art is one of the urgent issues to be solved in the current industry.

SUMMARY

The present disclosure provides a heat dissipation device, comprising: a casing; a base unit combined with the casing to form a water collecting chamber, a water inlet chamber, an action space and a water outlet chamber, wherein the water collecting chamber is communicated with the water inlet chamber, and the action space is communicated with the water inlet chamber and the water outlet chamber; a heat transfer structure disposed on an inner side of the base unit for transferring a heat energy generated by a heat source in contact with an outer side of the base unit to a working medium in the action space; a water inlet pipeline unit communicated with the water collecting chamber; a water outlet pipeline unit communicated with the water outlet chamber; and a pump unit disposed outside the casing and the base unit and connected with the water inlet pipeline unit and the water outlet pipeline unit, wherein the pump unit drives the working medium in the action space to flow out from the water outlet pipeline unit, and drives the working medium to flow in from the water inlet pipeline unit.

In the aforementioned heat dissipation device, the pump unit includes a first pump and a second pump, and the water inlet pipeline unit includes a first water inlet pipe, a second water inlet pipe and two serial pipes, wherein the first pump communicates with the water outlet pipeline unit, and communicates with the water collecting chamber via the first water inlet pipe, and the second pump communicates with the water collecting chamber via the second water inlet pipe, and the first pump and the second pump communicate with each other via the two serial pipes.

In the aforementioned heat dissipation device, the working medium flows into the first pump and the second pump via the water outlet pipeline unit and the two serial pipes, and is driven by the first pump and the second pump to flow into the water collecting chamber from the first water inlet pipe and the second water inlet pipe.

In the aforementioned heat dissipation device, the first water inlet pipe and the second water inlet pipe are spaced apart from each other and communicate with two sides of the water collecting chamber respectively.

In the aforementioned heat dissipation device, the casing has a guide channel, wherein the guide channel is used for connecting the water collecting chamber and the water inlet chamber and is located between the first water inlet pipe and the second water inlet pipe.

In the aforementioned heat dissipation device, the casing has a guide bump, wherein the guide bump is disposed on an inner side of the casing and abuts against the heat transfer structure after the base unit and the casing are combined.

In the aforementioned heat dissipation device, the guide bump has two guide slopes facing the water inlet chamber and the water outlet chamber respectively, wherein the two guide slopes are used for guiding the working medium to flow into the action space and flow out from the action space.

In the aforementioned heat dissipation device, the heat dissipation device further comprises a heat dissipation unit disposed on the water outlet pipeline unit for heat dissipation of the working medium.

In the aforementioned heat dissipation device, one end of the heat transfer structure connected to the water inlet chamber is in a concave arc shape.

In the aforementioned heat dissipation device, a flow direction of the working medium flowing out of the heat transfer structure and a flow direction of the working medium flowing into the water outlet pipeline unit are perpendicular to each other.

DETAILED DESCRIPTIONS

Figure 1:
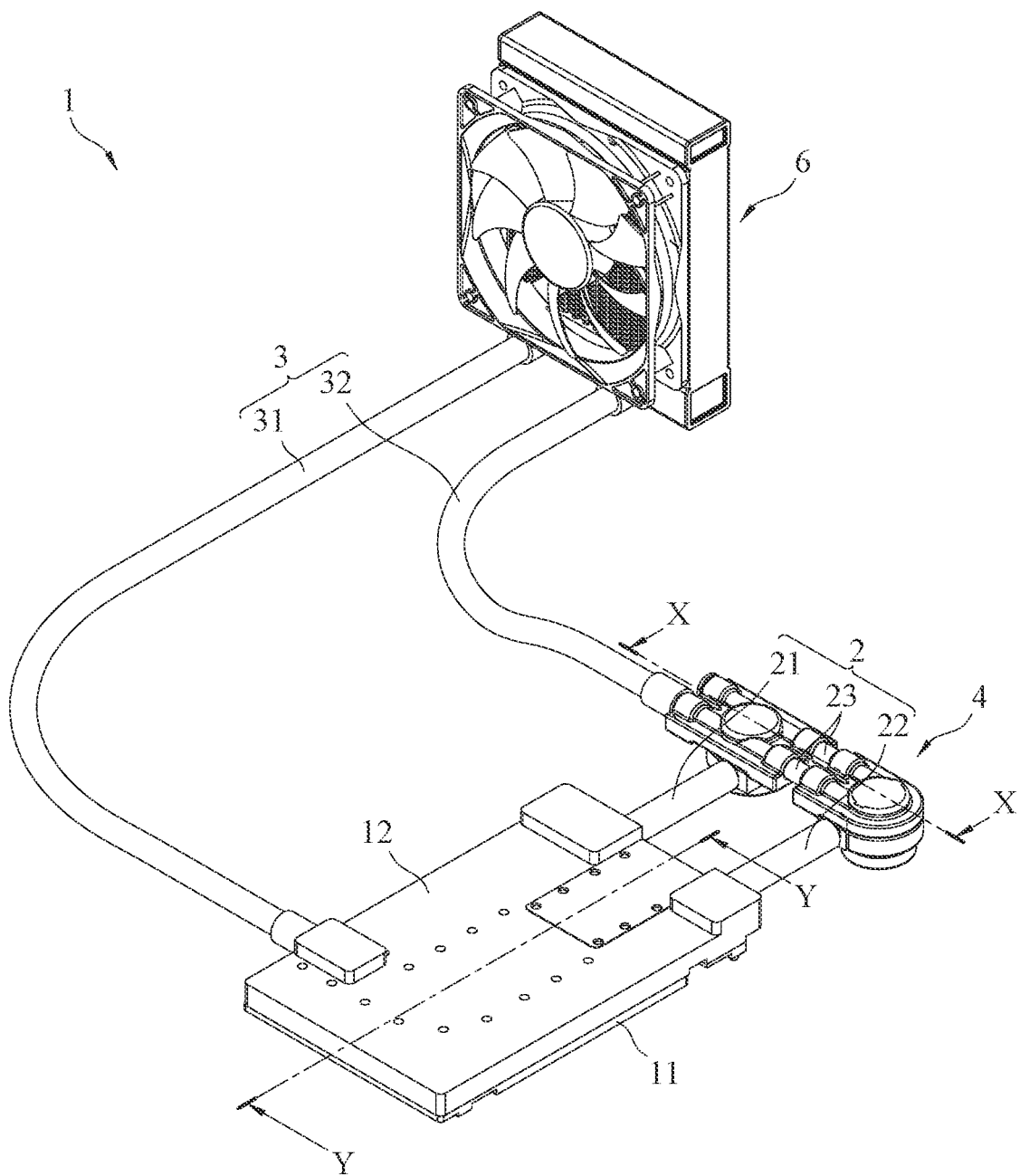
FIG. 1 is a schematic overall view of a heat dissipation device according to the present disclosure.

The following describes the implementation of the present disclosure with examples. Those skilled in the art can easily understand the other advantages and effects of the present disclosure from the content disclosed in this specification, and can implement or apply the present disclosure according to other examples.

Please refer to FIG. 1, FIG. 4, FIG. 5 and FIG. 6 at the same time, a heat dissipation device 1 of the present disclosure includes a base unit 11, a casing 12, a water inlet pipeline unit 2, a water outlet pipeline unit 3, a pump unit 4 and a heat transfer structure 5. The base unit 11 has a first bottom plate 111 and a second bottom plate 112, wherein a water collecting chamber 13 can be formed after the first bottom plate 111 and the casing 12 are combined, and a water inlet chamber 14, an action space 15 and a water outlet chamber 16 can be formed after the second bottom plate 112 and the casing 12 are combined, and wherein the action space 15 is communicated with the water inlet chamber 14 and the water outlet chamber 16, and is filled with a working medium. In one embodiment, the materials of the first bottom plate 111 and the second bottom plate 112 can be selected from metals or other materials with good thermal conductivity.

The heat transfer structure 5 is disposed on the inner side of the base unit 11, and is disposed on the second bottom plate 112. The outer side of the second bottom plate 112 is used for contacting a heat source, so the heat energy generated by the heat source can be transferred to the working medium in the action space 15 via the second bottom plate 112 and the heat transfer structure 5, and the working medium is heated up accordingly. In one embodiment, the heat source may be a graphics processor and its surrounding electronic elements, and the heat transfer structure 5 may be composed of a plurality of skived fins, wherein the material of the fins can be copper or aluminum, or other pillar, sheet-like, or even irregular-shaped fins, as long as the area in contact with the working medium can be increased, the heat energy can be transferred to the working medium faster, but the present disclosure is not limited thereto. In one embodiment, the plurality of fins at one end of the heat transfer structure 5 connected to the water inlet chamber 14 are in a concave arc shape 51, so that the working medium of the water inlet chamber 14 can more easily enter between the plurality of fins (i.e., the action space 15).

The casing 12 has a guide channel 121, water inlets 122 and 123, a water outlet 124, a guide bump 125 and an upper cover 126. The guide channel 121 is used to connect the water collecting chamber 13 and the water inlet chamber 14 and communicate with each other. The water inlets 122 and 123 are disposed on the same short side of the casing 12, and are respectively connected to the water collecting chamber 13 and are spaced apart from each other, so that the guide channel 121 is located between the water inlets 122 and 123. The water outlet 124 is disposed on a long side of the casing 12 and communicates with the water outlet chamber 16. The guide bump 125 is disposed on the inner side of the casing 12, corresponds to the action space 15, and is located between the water inlet chamber 14 and the water outlet chamber 16. After the base unit 11 is combined with the casing 12, the guide bump 125 can abut against the heat transfer structure 5, so that the working medium can be surely introduced into the heat transfer structure 5 and the contact area between the working medium and the heat transfer structure 5 can be increased. In one embodiment, the guide bump 125 may have two guide slopes 1251 and 1252, wherein the guide slope 1251 faces the water inlet chamber 14 to guide the working medium to flow into the action space 15, and the guide slope 1252 faces the water outlet chamber 16 to guide the working medium to flow out from the action space 15. For instance, the guide slopes 1251 and 1252 make the guide bump 125 have an inverted trapezoidal structure. The upper cover 126 is disposed on the top side of the casing 12 and corresponds to the guide channel 121.

A cold plate composed of the base unit 11 and the casing 12 can be installed on a graphics card. The inside of the cold plate can be filled with a working medium (such as coolant), which can absorb the heat energy generated by a heat source (such as a graphics processor or its surrounding electronic elements). The heated working medium can be sent out of the cold plate for cooling, and the cooled working medium can be sent back to the cold plate for the next heat absorption and circulation flow. In other embodiments, the cold plate of the present disclosure can also be installed on a central processing unit of an electronic device such as a computer host or a server, but is not limited thereto.

The water inlet pipeline unit 2 communicates with the water collecting chamber 13 and is connected with the pump unit 4. For example, please refer to FIG. 2, the water inlet pipeline unit 2 has a first water inlet pipe 21, a second water inlet pipe 22 and two serial pipes 23, wherein the first water inlet pipe 21 is connected to the water inlet 123, and the second water inlet pipe 22 is connected to the water inlet 122. The pump unit 4 is disposed outside the casing 12 and the base unit 11, and includes a first pump 41 and a second pump 42. The first pump 41 communicates with one side of the water collecting chamber 13 via the first water inlet pipe 21 and the water inlet 123, and the second pump 42 communicates with the other side of the water collecting chamber 13 via the second water inlet pipe 22 and the water inlet 122. The two serial pipes 23 are connected between the first pump 41 and the second pump 42, so that the first pump 41 and the second pump 42 communicate with each other.

The water outlet pipeline unit 3 communicates with the water outlet chamber 16. For instance, the water outlet pipeline unit 3 may have a first water outlet pipe 31 and a second water outlet pipe 32. One end of the first water outlet pipe 31 is connected to the water outlet 124 and communicated with the water outlet chamber 16, and one end of the second water outlet pipe 32 is connected to the first pump 41. The heat dissipation device 1 of the present disclosure can further include a heat dissipation unit 6, and the other end of the first water outlet pipe 31 and the other end of the second water outlet pipe 32 can be connected to the heat dissipation unit 6. A path for the working medium to flow can be provided in the heat dissipation unit 6, and a fan, for example, can be used on the path to dissipate the heat and cool the working medium.

Figure 2:
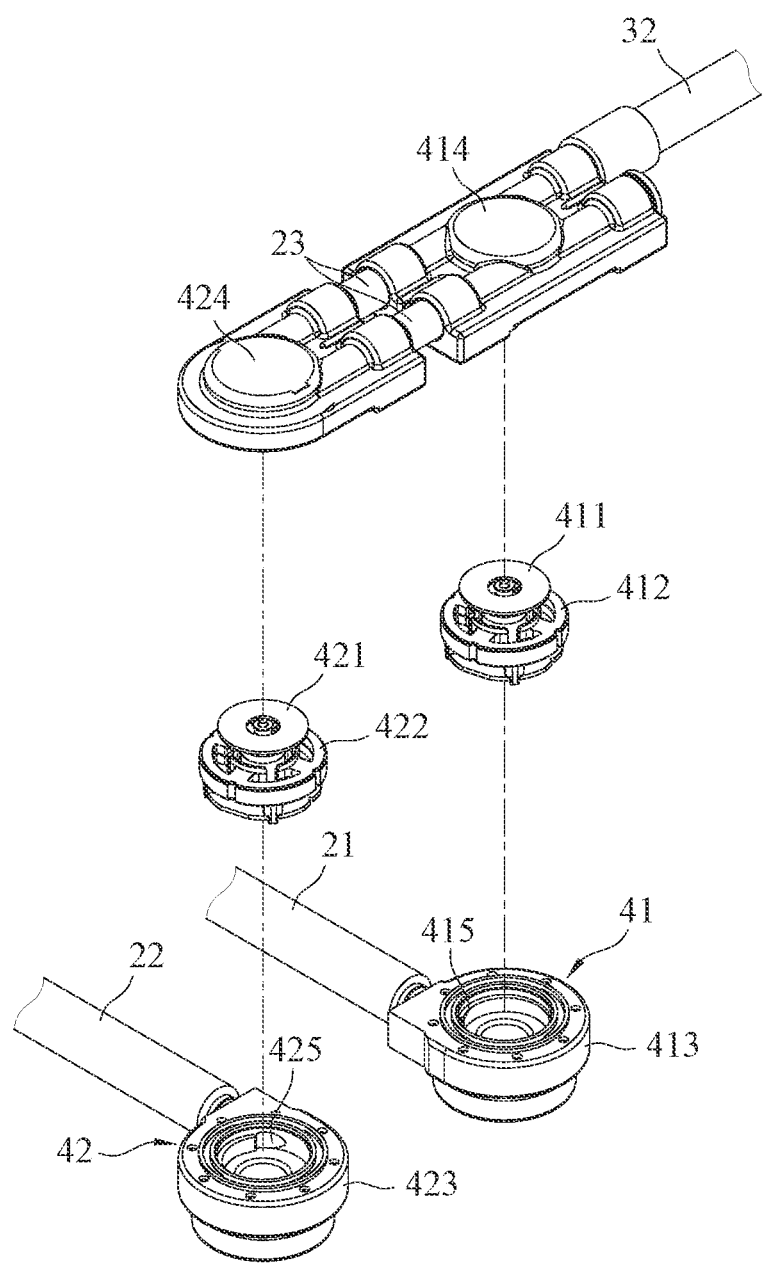
FIG. 2 is a schematic exploded view of a pump unit in the heat dissipation device according to the present disclosure.
Figure 3:
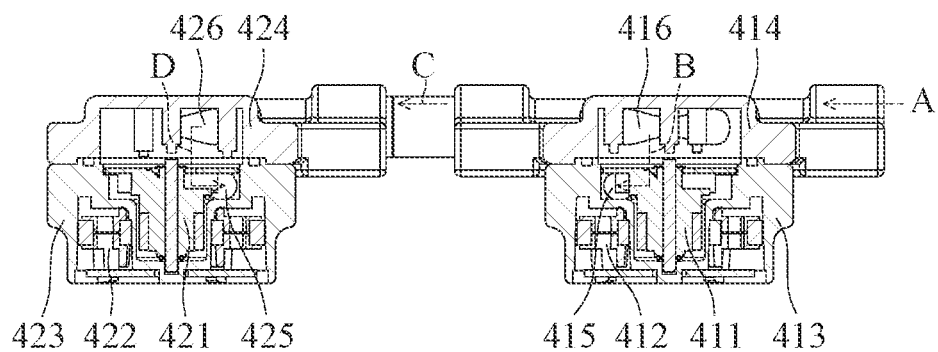
FIG. 3 is a schematic cross-sectional view of a X-X section line in FIG. 1.
Figure 4:
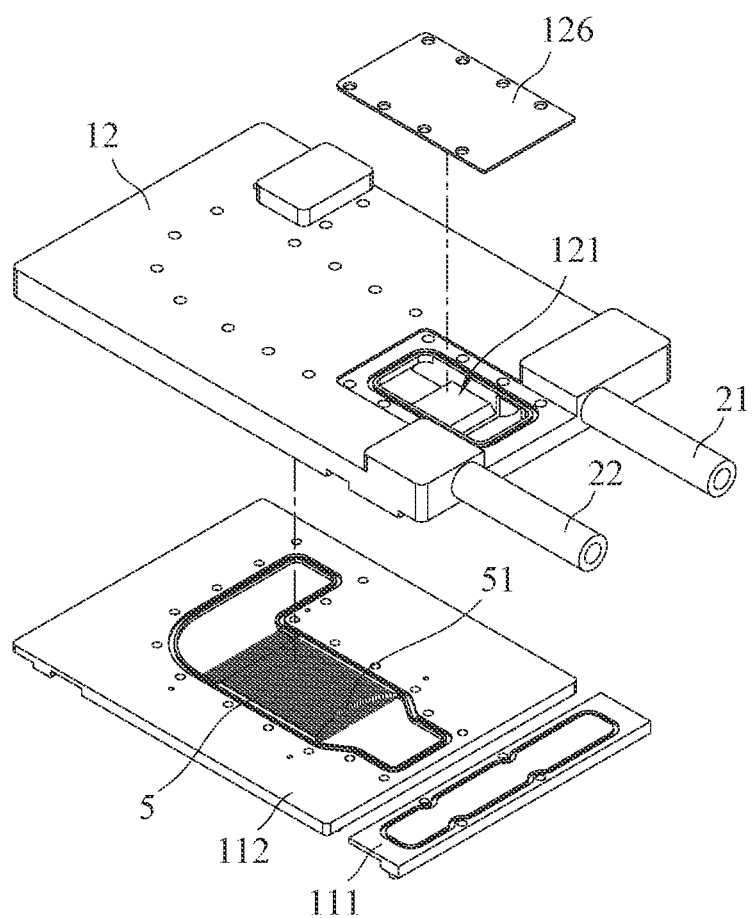
FIG. 4 is a schematic exploded view of a base unit and a casing in the heat dissipation device according to the present disclosure.
Figure 5:
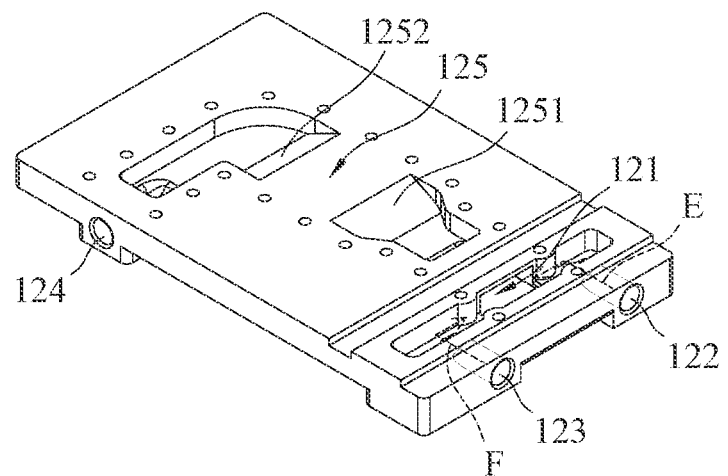
FIG. 5 is a schematic view from a different viewing angle of the casing in the heat dissipation device according to the present disclosure.
Figure 6:
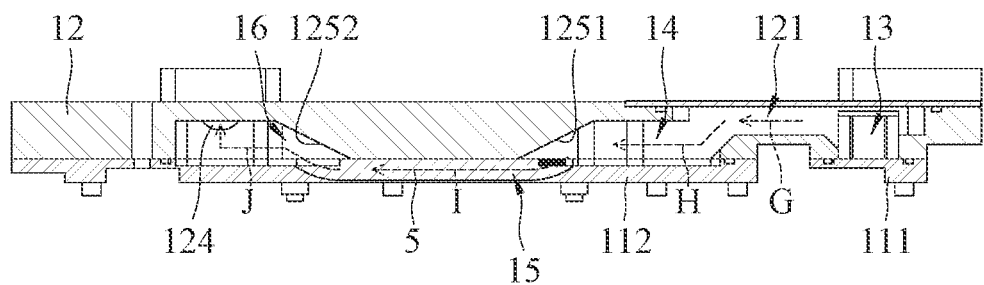
FIG. 6 is a schematic cross-sectional view of a Y-Y section line in FIG. 1.

Please refer to FIG. 2 and FIG. 3, the first pump 41 includes a fan blade 411, a magnetic element 412, a lower casing 413, an upper casing 414, a water discharging port 415 and a water entering port 416. The fan blade 411 and the magnetic element 412 are disposed in the lower casing 413, the upper casing 414 can be combined with the lower casing 413, the water entering port 416 is formed in the upper casing 414 and communicates with the second water outlet pipe 32, and the water discharging port 415 is formed in the lower casing 413 and communicates with the first water inlet pipe 21. The second pump 42 includes a fan blade 421, a magnetic element 422, a lower casing 423, an upper casing 424, a water discharging port 425 and a water entering port 426. The fan blade 421 and the magnetic element 422 are disposed in the lower casing 423, the upper casing 424 can be combined with the lower casing 423, the water entering port 426 is formed in the upper casing 424 and communicates with the serial pipe 23, and the water discharging port 425 is formed in the lower casing 423 and communicates with the second water inlet pipe 22. In one embodiment, the fan blades 411 and 421 have dual functions of sucking and discharging the working medium at the same time. The magnetic elements 412 and 422 can be selected from magnets or other materials that can be driven or attracted by a magnetic field. In addition, the magnetic elements 412, 422 are combined with the fan blades 411, 421, when the first pump 41 and the second pump 42 are powered on, under a combined action of the magnetic elements 412 and 422, the fan blades 411 and 421 can be driven to rotate, thereby guiding the working medium to generate flow. In addition, the space between the upper casings 414, 424 and the fan blades 411, 421 plus the space in the two serial pipes 23 can also be used as a water collecting area before the working medium is sucked by the fan blades 411, 421.

The operation of the heat dissipation device 1 of the present disclosure is described below.

The working medium enters the first pump 41 via the second water outlet pipe 32 and the water entering port 416 (such as arrow A), and the working medium can be driven when the fan blade 411 is actuated, and the working medium is sucked and discharged from the water discharging port 415 (such as arrow B). Part of the working medium that is not sucked by the fan blade 411 can enter the second pump 42 via the serial pipe 23 and the water entering port 426 (such as arrow C). The working medium can be driven when the fan blade 421 is actuated, and the working medium is sucked and discharged from the water discharging port 425 (such as arrow D). After the working medium leaves the pump unit 4, it enters the water collecting chamber 13 via the first water inlet pipe 21, the second water inlet pipe 22 and the water inlets 122, 123 (such as arrows E, F), and can enter into the water inlet chamber 14 via the guide channel 121 (such as arrow G). At this time, the working medium can be guided by the guide slope 1251 and enter the action space 15 (such as arrows H, I). When flowing between the plurality of fins of the heat transfer structure 5, the working medium can absorb the heat energy generated by the heat source and increase the temperature. The heated working medium can enter the water outlet chamber 16 via the guidance of the guide slope 1252, and then be discharged from the water outlet 124 (such as arrow J), and reach the heat dissipation unit 6 via the first water outlet pipe 31 for cooling. The cooled working medium can flow back into the first pump 41 via the second water outlet pipe 32, so that the next heat dissipation cycle can be performed. In one embodiment, the flow direction of the working medium flowing out of the heat transfer structure 5 and the flow direction of the working medium flowing into the water outlet pipeline unit 3 are perpendicular to each other, but the present disclosure is not limited to as such.

To sum up, in the heat dissipation device of the present disclosure, the pump unit is disposed outside the casing and the base unit. The user can flexibly set the position of the pump unit according to the needs, and it is not necessary to set the pump unit above the heat source, which can effectively reduce the overall volume and enable the base unit to cover the graphics processor and its surrounding electronic elements at the same time to dissipate heat. In addition, the pumps are designed in series, and the number of pumps can be increased as needed, so there will be no situation where the pump fails and the whole operation stops. The power of the plurality of pumps for driving the working medium can cope with the large amount of heat energy generated by the graphics processor, resulting in better heat dissipation performance.

The foregoing embodiments are used for the purpose of illustrating the principles, features and effects rather than limiting the present disclosure. Anyone skilled in the art can modify and alter the above embodiments without departing from the spirit and scope of the present disclosure. However, any equivalent modifications and changes made by using the teaching content of the present disclosure should still be covered by the claims below. Therefore, the range claimed by the present disclosure should be as described by the accompanying claims listed below.

What is claimed is:

1. A heat dissipation device, comprising:
a casing;
a base unit combined with the casing to form a water collecting chamber, a water inlet chamber, an action space and a water outlet chamber, wherein the water collecting chamber is communicated with the water inlet chamber, and the action space is communicated with the water inlet chamber and the water outlet chamber;
heat transfer fins disposed on an inner side of the base unit for transferring a heat energy generated by a heat source in contact with an outer side of the base unit to a working medium in the action space;
a water inlet pipeline unit communicated with the water collecting chamber;
a water outlet pipeline unit communicated with the water outlet chamber; and
a pump unit disposed outside the casing and the base unit and connected with the water inlet pipeline unit and the water outlet pipeline unit, wherein the pump unit drives the working medium in the action space to flow out from the water outlet pipeline unit, and drives the working medium to flow in from the water inlet pipeline unit,
wherein the pump unit includes a first pump and a second pump, and the water inlet pipeline unit includes a first water inlet pipe, a second water inlet pipe and two serial pipes, and wherein the first pump communicates with the water outlet pipeline unit, and communicates with the water collecting chamber via the first water inlet pipe, and the second pump communicates with the water collecting chamber via the second water inlet pipe, and the first pump and the second pump communicate with each other via the two serial pipes.

2. The heat dissipation device of claim 1, wherein the working medium flows into the first pump and the second pump via the water outlet pipeline unit and the two serial pipes, and is driven by the first pump and the second pump to flow into the water collecting chamber from the first water inlet pipe and the second water inlet pipe.

3. The heat dissipation device of claim 1, wherein the first water inlet pipe and the second water inlet pipe are spaced apart from each other and communicate with two sides of the water collecting chamber respectively.

4. The heat dissipation device of claim 1, wherein the casing has a guide channel, and wherein the guide channel is used for connecting the water collecting chamber and the water inlet chamber and is located between the first water inlet pipe and the second water inlet pipe.

5. The heat dissipation device of claim 1, wherein the casing has a guide bump, and wherein the guide bump is disposed on an inner side of the casing and abuts against the heat transfer fins after the base unit and the casing are combined.

6. The heat dissipation device of claim 5, wherein the guide bump has two guide slopes facing the water inlet chamber and the water outlet chamber respectively, and wherein the two guide slopes are used for guiding the working medium to flow into the action space and flow out from the action space.

7. The heat dissipation device of claim 1, further comprising a heat dissipation fan disposed on the water outlet pipeline unit for heat dissipation of the working medium.

8. The heat dissipation device of claim 1, wherein one end of the heat transfer fins connected to the water inlet chamber is in a concave arc shape.

9. The heat dissipation device of claim 1, wherein a flow direction of the working medium flowing out of the heat transfer fins and a flow direction of the working medium flowing into the water outlet pipeline unit are perpendicular to each other.

* * * * *